United States Patent [19]

Schemmel et al.

[11] Patent Number: 4,551,186

[45] Date of Patent: Nov. 5, 1985

[54] METHOD OF MAKING GAINASP LAYERS FOR PHOTODETECTORS

[75] Inventors: Gerald Schemmel, Asperg; Richard Linnebach, Erdmannhausen, both of Fed. Rep. of Germany

[73] Assignee: International Standard Electric Corporation, New York, N.Y.

[21] Appl. No.: 525,769

[22] Filed: Aug. 23, 1983

[30] Foreign Application Priority Data

Aug. 28, 1982 [DE] Fed. Rep. of Germany ....... 3232115

[51] Int. Cl.$^4$ .......................................... H01L 21/208
[52] U.S. Cl. .................................. 148/171; 148/171; 148/172; 29/572; 29/576 E
[58] Field of Search .................. 148/171, 172; 29/572, 29/576 E

[56] References Cited

U.S. PATENT DOCUMENTS

| | | | |
|---|---|---|---|
| 4,142,924 | 3/1979 | Hsieh | 148/171 |
| 4,319,937 | 3/1982 | Holonyak et al. | 148/171 |
| 4,355,396 | 10/1982 | Hawrylo et al. | 148/172 X |
| 4,372,791 | 2/1983 | Hsieh | 148/171 |
| 4,373,989 | 2/1983 | Mattauch et al. | 148/171 X |
| 4,377,865 | 3/1983 | Sugino et al. | 372/45 |
| 4,382,265 | 5/1983 | Pearsall | 148/171 X |

OTHER PUBLICATIONS

Hsieh, *IEEE J. of Quantum Electronics*, vol. QE-17, No. 2, Feb. 1981, pp. 118–122.
Stringfellow, *J. of Crystal Growth*, vol. 27 (1974), pp. 21–34.
Takahei et al., *Japanese Journal of Applied Physics*, vol. 20, No. 4, Apr. 1981, pp. L313–L316.

*Primary Examiner*—George T. Ozaki
*Attorney, Agent, or Firm*—James B. Raden; Harold J. Holt

[57] ABSTRACT

A method for making the light-sensitive layer of a GaInAsP photodetector for the wavelength range from about 1350 nm to 1400 nm by liquid-phase epitaxy. A melt is saturated with phosphorus by introducing a first InP substrate into a ternary solution of GaAs and InAs in indium and maintaining the temperature constant at about 690° C. for a few hours. After removal of the first substrate, the temperature is lowered by about 5° C., and a second InP substrate, on which the desired layer is grown, is introduced into the melt. The cooling rate is approximately 1° C./hr.

5 Claims, No Drawings

METHOD OF MAKING GAINASP LAYERS FOR PHOTODETECTORS

The present invention relates to a method of making $Ga_xIn_{l-x}As_yP_{l-y}$ layers for photodetectors wherein the Ga and As components are chosen so that, during the growth of the layer on an InP substrate, the crystal lattices at the layer-substrate junction match, and that the energy gap lies in the range between 0.905 eV and 0.875 eV. This corresponds to photoluminescence wavelengths of 1370 nm and 1420 nm, respectively. Photodetectors with such layers can detect wavelengths up to about 1350 nm and 1400 nm, respectively.

Optical communication and, consequently, the use of optical fibers are gaining increasing importance. The attenuation characteristic of an optical fiber also determines the wavelengths that can be used. At the receiving end, photodetectors are frequently employed which have a light-sensitive layer of $Ga_{0.47}In_{0.53}As$ whose range of sensitivity extends to approximately 1600 nm. GaInAsP photodetectors are better suited for shorter wavelengths because they have a smaller dark current. The fabrication of GaInAsP photodetectors for the above-mentioned wavelength range (1350 nm to 1400 nm) has not previously been known. High sensitivity is obtained only if the layer is so thick as to absorb most of the light. To obtain detectors of low capacitance, highly pure layers are required which are approximately 5 μm thick. Imperfections in the layer, such as lattice defects or an uneven surface, greatly impair the performance of the detector.

For technological reason, such photodiodes are commonly deposited on an InP substrate. For easier processibility, a <100> oriented InP crystal is used. As the crystal lattices of the substrate and the layer shoud match at the junction, the lattice constant for the layer should thus be equal to the value of the lattice constant for InP. The bandgap in the layer is determined by the operating wavelength Bandgap and lattice constant determine the exact composition of the layer.

The requirements for the composition and thickness of the layer are known. K. Takahei and H. Nagai report on their pertienient experiments in "Jpn. J. Appl. Phys.", Vol. 20, No. 4, 1981, letter L 313. In the wavelength range from about 1300 nm to 1420 nm, problems were encountered with the crystal growth: they achieved only layers less than 1 μm thick; at greater thicknesses (up to a maximum of 1.5 μm), a smooth surface was not achievable. Takahei and Nagai used temperatures of 590° C. and 640° C.

The object of this invention is to provide a liquid-phase epitaxy manufacturing method which allows GaInAsP layers of more than 3 μm in thickness to be deposited on InP. The composition of the layer is chosen so that the bandgap corresponds to a photoluminescence wavelength in the range between 1370 nm and 1420 nm, and the crystal lattices at the layer-substrate junction match.

In accordance with the invention, $Ga_xIn_{l-x}As_yP_{l-y}$ layers for photodetectors are produced by a process wherein the Ga and As components are chosen so that, during the growth of the layer on an InP substrate, the crystal lattices at the layer-substrate junction match and the energy gap lies in the range between 0.905 eV and 0.875 eV; said process being characterized by contacting a melt consisting of a ternary solution of GaAs and InAs in indium and having the proper percentages of Ga and As with a first InP substrate at a first temperature for a few hours and then separating the melt from the substrate to obtain the proper quaternary composition of the starting material, growing the layer by contacting a second InP substrate with the quaternary melt at a second temperature, the first temperature being a constant temperature lying a few degrees Celsius above the temperature at which the layer is grown, and the second temperature being a temperature lying clearly above 640° C.

In accordance with preferred embodiments of the invention, the growth of the layer starts at a second temperature of about 685° C., the first temperature is held about 5° C. above the second temperature and the second temperature is lowered at a low cooling rate, e.g. approximately 1° C./hr.

An embodiment of the invention will now be explained in more detail.

A $Ga_{0.31}In_{0.69}As_{0.69}P_{0.31}$ layer is used for a photoluminescence wavelength of 1370 nm, and a $Ga_{0.34}In_{0.66}As_{0.75}P_{0.25}$ layer for 1420 nm. In the following discussion, essentially only the differences from known methods will be described. The most significant difference lies in the fact that the crystal growth takes place at temperatures clearly above 640° C. (in the present example, a temperature of 685° C. is used). Particular importance is also attached to the proper composition of the melt.

A melt of indium, GaAs, and InAs is prepared at a temperature lying about 5° C. above the temperature for the crystal growth (690° C. in this example). The percentage of Ga and As correspond to the percentages in the subsequent, quarternary solution. The ternary melt thus obtained is brought into contact with an InP substrate. The presence of an excess of phosphorus ensures that the subsequent quarternary melt has the proper phosphorus content. After a few hours, the melt is saturated with phosphorus. The substrate is then removed. Throughout this period, the temperature is maintained constant (at 690° C.).

The melt is then cooled by 5° C. and brought into contact with another InP substrate. In about 30 minutes, a crystal layer approximately 6 μm thick is grown on the substrate. The melt may be allowed to cool only slightly during this time; the temperature variation must be steady.

The other process steps, such as firing or, if necessary, deposition of a covering InP layer, are performed in known manner.

By this method, layers of the above-mentioned thickness and with carrier concentrations of $1 \times 10^{15} cm^{-3}$ (at 300° C.) and carrier mobilities above 12,000 cm$^2$/Vs can be formed.

We claim:

1. Method of making $Ga_xIn_{l-x}As_yP_{l-y}$ layers for photodetectors wherein the Ga and As components are chosen so that, during the growth of the layer on an InP substrate, the crystal lattices at the layer-substrate junction match, and the energy gap lies in the range between 0.905 eV and 0.875 eV, characterized by, contacting a melt consisting of a ternary solution of GaAs and InAs in indium and having the proper percentages of Ga and As with a first InP substrate at a first temperature for a few hours and then separating the melt from the substrate to obtain the proper quaternary composition of the starting material, growing the layer by contacting a second InP substrate with the quaternary melt at a second temperature,
the first temperature being a constant temperature lying slightly above the temperature at which the layer is grown, and the second temperature being a temperature lying clearly above 640° C.

2. A method as claimed in claim 1, characterized in that the growth of the layer starts at a temperature of about 685° C.

3. A method as claimed in claim 1 or 2, characterized in that the first temperature is held about 5° C. above the second temperature at which the growth of the layer begins.

4. A method as claimed in claim 1, characterized in that the second temperature is lowered at a low cooling rate.

5. A method as claimed in claim 4, characterized in that the temperature is lowered at approximately 1° C./hour.

* * * * *